(12) United States Patent
Takayanagi (10) Patent No.: US 6,999,372 B2
(45) Date of Patent: Feb. 14, 2006

(54) MULTI-PORTED MEMORY CELL (75) Inventor: Toshinari Takayanagi, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/391,278

(22) Filed: Mar. 18, 2003

(65) Prior Publication Data

US 2004/0184342 A1    Sep. 23, 2004

(51) Int. Cl.
*G11C 8/00* (2006.01)
*G11C 11/00* (2006.01)

(52) U.S. Cl. .............. 365/230.05; 365/154; 365/156

(58) Field of Classification Search .......... 365/230.05, 365/154, 156
See application file for complete search history.

(56) References Cited

U.S. PATENT DOCUMENTS

| | | | |
|---|---|---|---|
| 5,136,545 A | | 8/1992 | Takayanagi |
| 5,210,236 A | | 5/1993 | Takayanagi |
| 5,287,323 A | * | 2/1994 | Takahashi et al. ..... 365/230.05 |
| 5,317,201 A | | 5/1994 | Takayanagi |
| 5,396,448 A | | 3/1995 | Takayanagi et al. |
| 5,590,087 A | * | 12/1996 | Chung et al. .......... 365/230.05 |
| 5,642,325 A | * | 6/1997 | Ang ...................... 365/230.05 |
| 5,715,426 A | | 2/1998 | Takahashi et al. |
| 5,923,608 A | * | 7/1999 | Payne .................... 365/230.05 |
| 6,011,713 A | | 1/2000 | Yamane et al. |
| 6,046,946 A | * | 4/2000 | Nadeau-Dostie et al. .............. 365/230.05 |
| 6,288,969 B1 | * | 9/2001 | Gibbins et al. ........ 365/230.05 |
| 6,289,438 B1 | | 9/2001 | Takayanagi |
| 6,343,039 B1 | | 1/2002 | Agawa et al. |
| 6,505,225 B1 | | 1/2003 | Takayanagi |
| 6,535,417 B1 | * | 3/2003 | Tsuda et al. ........... 365/230.05 |
| 6,661,733 B1 | * | 12/2003 | Pan et al. .............. 365/230.05 |
| 2001/0007537 A1 | | 7/2001 | Agawa et al. |

FOREIGN PATENT DOCUMENTS

| | | |
|---|---|---|
| JP | 06-203576 | 7/1994 |
| JP | 10188571 | 7/1998 |
| JP | 2000122924 | 4/2000 |
| JP | 2001195885 | 7/2001 |
| JP | 2001216136 | 8/2001 |
| KR | 89910 | 11/1992 |

* cited by examiner

Primary Examiner—Trong Phan
(74) Attorney, Agent, or Firm—Hamilton & Terrile, LLP; Michael Rocco Cannatti (57) ABSTRACT

A multi-port semiconductor memory device is provided with current limiting transistor devices interposed between the memory cell and the bit line transfer gates for multiple bit line pairs. Where each bit line pair represents a memory port that is connected to the memory cell during read and write operations, the current limiting transistor devices effectively reduce the current flow from non-writing bit lines, thereby improving memory writability. In addition, the current limiting transistor devices effectively reduce the current flow to non-reading bit lines, thereby improving memory stability.

20 Claims, 7 Drawing Sheets

MULTI-PORTED MEMORY CELL

BACKGROUND OF THE INVENTION

1. Field of the Invention

The present invention generally relates to the field of digital electronic circuits, specifically, semiconductor memory devices adapted for use with computer systems. In one aspect, the present invention relates to a semiconductor memory device which has a multi-port function.

2. Description of the Related Art

Generally, a multi-port memory is a memory device having a number of ports for reading and writing and corresponding address and control ports, such that multiple locations in the memory can be simultaneously accessed. A plurality of word lines and a plurality of bit lines are connected to each memory cell of the multi-port memory. Multi-port memories may be used in a variety of applications, such as a cache memory which functions as a memory common to the CPUs incorporated in a multi-CPU system, or as an image memory in which the same address must be accessed at the same time.

With multi-port memories, some ports are dedicated to reading or writing. Alternatively, some of the ports may be used for both reading and writing, though not simultaneously on the same read/write port. With multi-port memories, multiple read and write operations can be performed in a clock cycle. Indeed, a read/write port can be used for both reading and writing when one access is performed in the first half cycle and another access is performed in the second half cycle.

Figure 1:
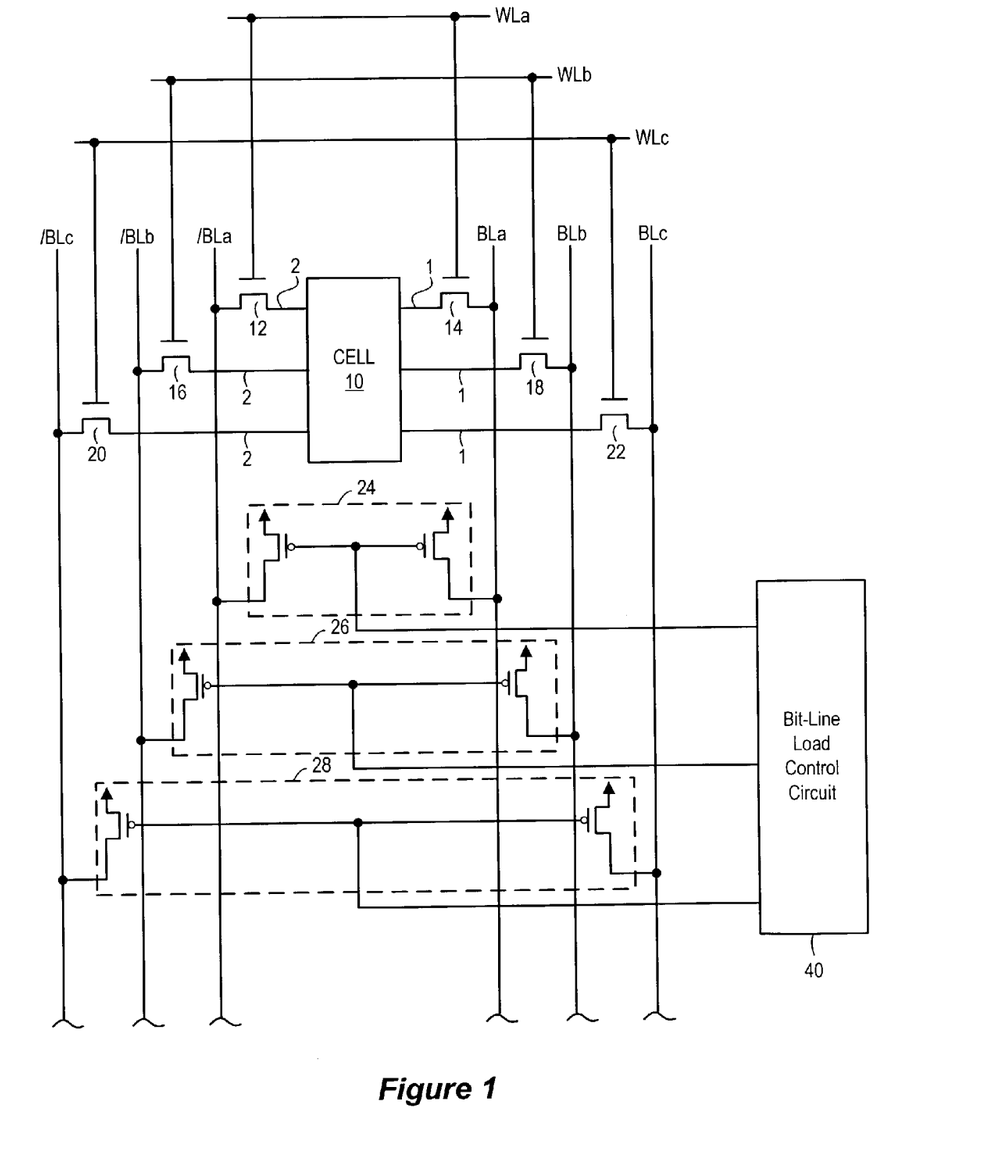
FIG. 1 shows a circuit diagram showing the structure of a conventional 3-port memory.

FIG. 1 is a circuit diagram showing a conventional 3-port memory device. In FIG. 1, the first memory node 1 of a memory cell 10, which comprises, for example, a static memory, is connected to a bit line BLa by a transfer gate 14 which is made of an MOS transistor. The gate of the transfer gate 14 is coupled to a word line WLa. The second memory node 2 of the memory cell 10 is connected to a bit line /BLa by a transfer gate 12 which is made of a MOS transistor. The gate of the transfer gate 12 is connected to a word line WLa. The first memory node 1 of the memory cell 10 is also connected to a bit line BLb by a transfer gate 18 which is made of a MOS transistor. The gate of the transfer gate 18 is coupled to a word line WLb. The second memory node 2 of the memory cell 10 is connected to a bit line /BLb by a transfer gate 16 which is made of a MOS transistor. The gate of the transfer gate 16 is coupled to a word line WLb. Further, the first memory node 1 of the memory cell 10 is connected to a bit line BLc by a transfer gate 22 which is made of a MOS transistor. The gate of the transfer gate 22 is coupled to a word line WLc. The second memory node 2 of the memory cell 10 is connected to a bit line /BLc by a transfer gate 20 which is made of a MOS transistor. The gate of the transfer gate 20 is coupled to a word line WLc. As shown, data read from the memory cell 10 may be output directly on a bit line (e.g., BLa), but the data in memory cell 10 may also be inverted by an inverter device (not drawn) before being connected to an output port by an access gate (e.g., transistor 14).

Bit-line load circuits 24, 26, 28 are provided between the bit lines (e.g., load circuit 24 is coupled between bit line BLa and bit line /BLa) for maintaining the potentials of these bit lines at a power-supply potential. Each bit-line load circuit comprises two gate-coupled MOS transistors, each of which has its current path connected, at one end, to a power-supply VDD and, at the other end, to a bit line. Each bit-line load circuit is controlled by a control signal from a bit line control circuit 40 that is provided to the gates of the MOS transistors in the bit-line load circuits 24, 26, 28.

The memory cell 10 stores data values opposite to each other. For example, the memory cell may be implemented as a pair of cross-coupled inverters connected in parallel between first and second memory nodes. Stored data values stored are transferred to the bit lines BLa and /BLa through the transfer gates 14 and 12, in accordance with the potential of the word line WLa. The data values opposite to each other and stored in the memory cell 10 are also transferred to the bit lines BLb and /BLb through the transfer gates 18 and 16, in accordance with the potential of the word line WLb. Further, the data values opposite to each other and stored in the memory cell 10 are also transferred to the bit lines BLc and /BLc through the transfer gates 22 and 20, in accordance with the potential of the word line WLc.

Each port in the memory is identified with respect to the input/output bit line pairs that are used to transfer data into and out of the memory cell. For example, in the three-port memory configuration depicted in FIG. 1, the input/output path using the bit lines BLa and /BLa can be referred to as a first port, the input/output path using the bit lines BLb and /BLb can be referred to as a second port, and the input/output path using the bit lines BLc and /BLc can be referred to as a third port.

As the port number M increases for a multi-port memory, it becomes increasingly difficult to have both stability and writability for the multi-ported cell when non-writing word-lines are activated. For example, where cross-coupled inverters are used for the memory cell, the operation window gets very marginal with conventional three-port memory cells, and can disappear entirely with conventional four-port memory cells. This is because required beta-ratio (which is ratio of the memory cell latch size divided by the access pass-gate size) for cell stability virtually gets M times smaller when not writing.

Figure 2:
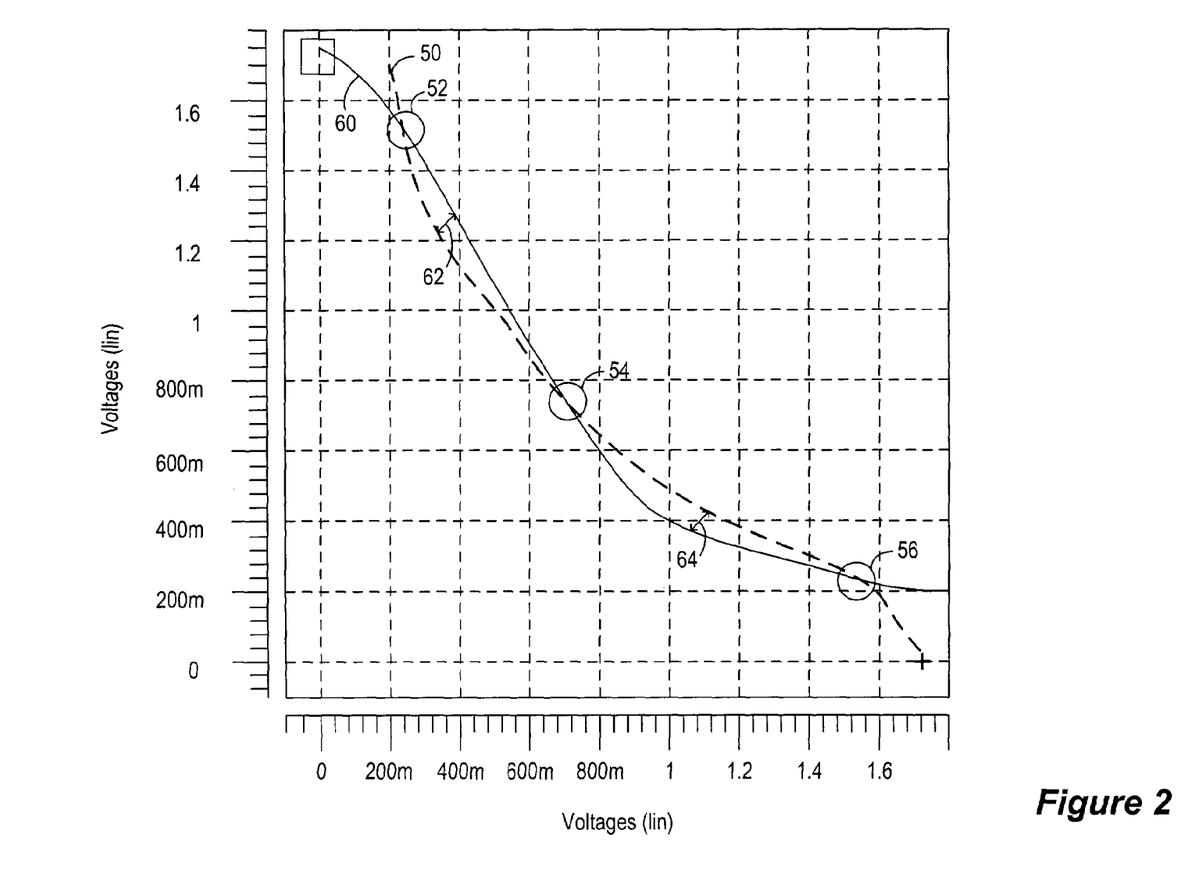
FIG. 2 is a chart illustrating the stability of a conventional 3-port memory.
Figure 3:
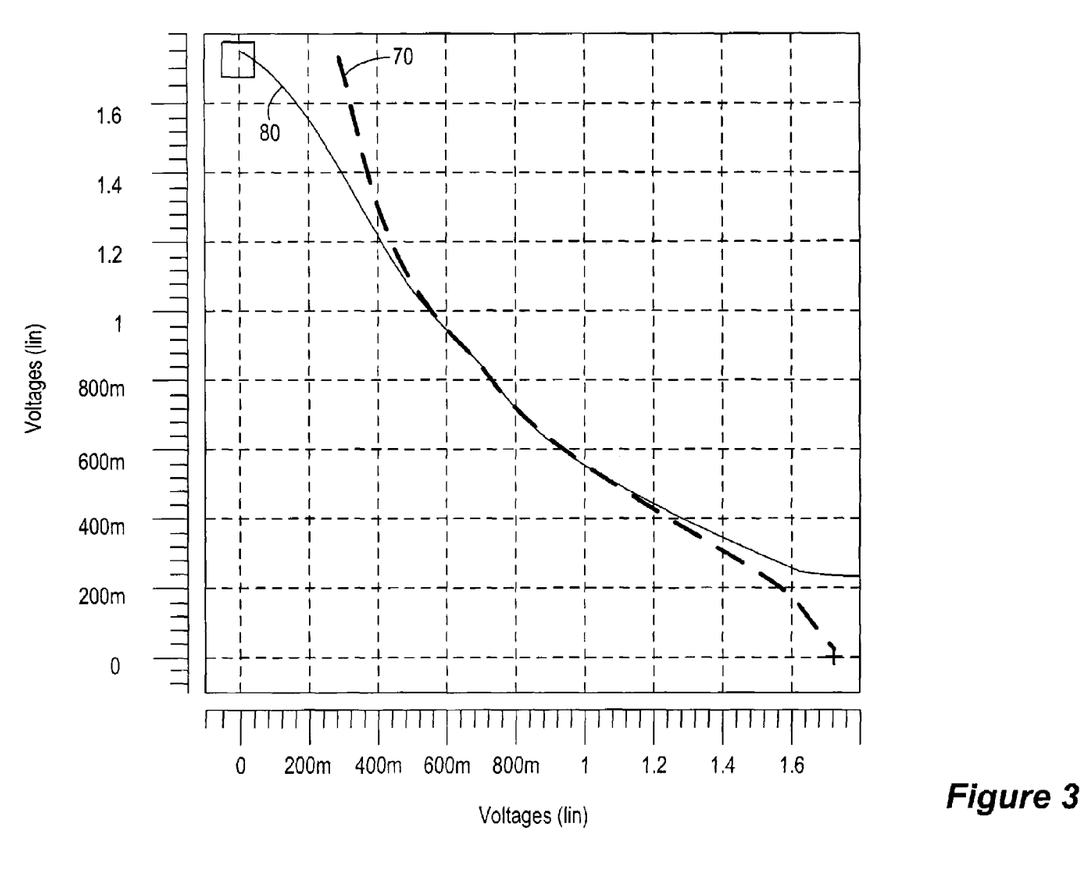
FIG. 3 is a chart illustrating the stability of a conventional 4-port memory.

The diminishing operation margin for cell stability is illustrated in FIGS. 2 and 3, which characterize the stability of the memory cell with the input/output characteristic curves for each inverter of a cross-coupled inverter memory cell in a 3-port memory (FIG. 2) and 4-port memory (FIG. 3). In accordance with conventional techniques for assessing the input/output characteristics of a memory cell, FIG. 2 shows two inverter transfer curves for first and second memory cell inverters. Waveform 50 represents the transfer characteristic (during data reading) for a first inverter in the cross-coupled inverter memory cell (rotated 180 degrees about a diagonal axis) and waveform 60 represents the transfer characteristic for a second inverter in the cross-coupled inverter memory cell. The outer intersection points 52, 56 represent stable points in the circuit operation, but point 54 represents a meta-stable point that is not really stable. As the spread 62, 64 between the curves 50, 60 increases, the stability of the memory device increases, but as the spread 62, 64 decreases, the stability of the memory device decreases.

The stability essentially disappears for a 4-port memory, as illustrated in FIG. 3, which shows inverter transfer waveform 70 (rotated 180 degrees about a diagonal axis) for the first inverter in the cross-coupled inverter memory cell and waveform 80 for the second inverter in the cross-coupled inverter memory cell. As shown in FIG. 3, there is essentially no stability for the 4-port memory device because there is no spread between the waveforms.

Further limitations and disadvantages of conventional systems will become apparent to one of skill in the art after reviewing the remainder of the present application with reference to the drawings and detailed description which follow.

SUMMARY OF THE INVENTION

In accordance with the present invention, normally-ON transistors are coupled between wordline pass-gates and the cell latch. By acting as a current limiter, these additional transistors act as current limiter to improve the beta-ratio and enhance operation margin for both cell stability and writability.

In accordance with another embodiment of the present invention, a multi-port semiconductor memory device is provided. The memory device includes a plurality of memory cells, each having a first and second memory node. In a selected embodiment, the memory cell is a pair of inverters cross-coupled in parallel between the first and second memory nodes. A current limiting device is coupled to each memory node. In a selected embodiment, each current limiting device is an MOS transistor or an insulated-gate transistor having a current path connected between a memory node and a transfer or access device. The gate of the current limiting device may be connected to a power supply voltage or otherwise controlled by a control signal to limit the amount of current that passes to and from the memory cell during data read and write operations. A plurality of transfer devices are coupled to each current limiting device. Each transfer device has a current path coupled between a bit line and the current limiting device to which it is coupled. With this coupling, data passes between the bit line and the memory node via the current limiting device under control of a word line signal that is applied to the transfer device. In a selected embodiment, each transfer device is a pair of insulated-gate transistors, each of which is coupled between a current limiting device and a bit line under control of a word line signal. Each transfer device may also include a second, third and fourth pair of insulated-gate transistors, each of which is connected between a current limiting device and a bit line. Additional pairs of insulated-gate transistors may also be included in the transfer device for transferring the stored data values from the memory cell to multiple bit line pairs (or in the reverse direction) in accordance with the additional word line signals.

BRIEF DESCRIPTION OF THE DRAWINGS

The present invention may be better understood, and its numerous objects, features and advantages made apparent to those skilled in the art by referencing the accompanying drawings.

DETAILED DESCRIPTION

In addition to providing a memory design that is stable (in terms of retaining the data content stored in the memory cell), there is a competing and potentially conflicting need for writability that must be balanced in the memory design. For example, memory stability is promoted by having smaller transfer or access gate sizes and larger NMOS gate sizes in the memory cell inverters. The ratio of these sizes is referred to as the beta-ratio, which is bigger for more stable memory designs, meaning that the NMOS driver gate in the memory cell inverters is larger and the transfer gate is smaller. However, with multi-port memories, the effective increase in the transfer gate size (because of the additional transfer gates for the additional ports) reduces the beta-ratio, meaning that the cell stability is diminished. Thus, to obtain stable memory cell operation, there is minimum beta-ratio value required for memory cell stability.

At the same time, cell writability is improved with weaker NMOS driver gates and larger transfer gates. In other words, writability is improved with a smaller beta-ratio. This is shown by an analysis of the input/output characteristic curves depicted in FIG. 4 which uses the waveforms for each inverter of a cross-coupled inverter memory cell when performing write operations to the memory cell to characterize the writability of the memory cell. As depicted, waveform 90 represents the transfer characteristic (during data writing) for a first inverter in the cross-coupled inverter memory cell (rotated 180 degrees about a diagonal axis) and waveform 92 represents the transfer characteristic for a second inverter in the cross-coupled inverter memory cell. With memory devices, there should by only one intersection point between the two waveforms, which is a stable point 94 (in other words, this is the write converging point) for write operations.

Figure 4:
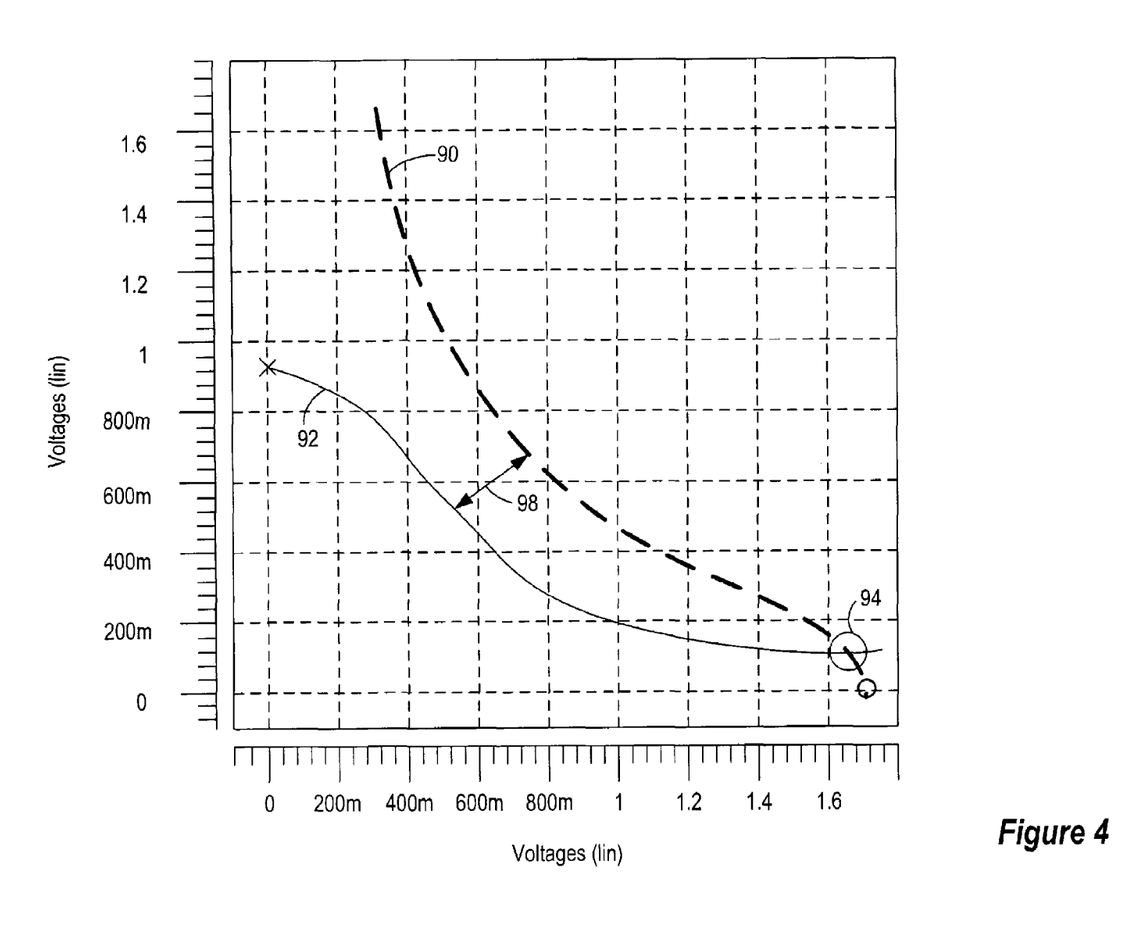
FIG. 4 is a chart illustrating the writability of a multi-port memory.

The smaller the beta-ratio, the greater the spread 98 between waveforms 90, 92. Conversely, as the beta-ratio increases, there is less separation between waveforms 90, 92. If the spread 98 reduces sufficiently or disappears, then there will be multiple intersection points between waveforms 90, 92, resulting in multiple stability points. Thus, if the beta-ratio is too large, the spread 98 between the inverter curves 90, 92 decreases so that there are multiple stability points for the inverters during writing, which is not desirable. Thus, there is maximum beta-ratio value required for memory cell writability.

Where multiple bit line pairs are connected to a memory cell in addition to the bit line pair that is reading or writing to the cell (such as when precharged bit lines are coupled to the memory cell in addition to the data-charged bit line pair that is reading or writing to the cell), excessive current flow from the bit lines impedes the memory cell performance. For example, during write operations, the activated transfer gates for the non-writing bit lines impede discharge of the bit line that is being used to write to the memory cell. As a result, as more ports and transfer gates are added, the minimum beta-ratio value required for stable read operations increases, and at the same time, the maximum beta-ratio value required for acceptable writability decreases.

In accordance with the present invention, current flow to the memory cell is limited by current limiting devices positioned between the memory cell and the transfer gates that are used for writing to the memory cell. By including a current limiting device at each memory cell node, the operational window between the minimum and maximum beta-ratio values is effectively increased.

Figure 5:
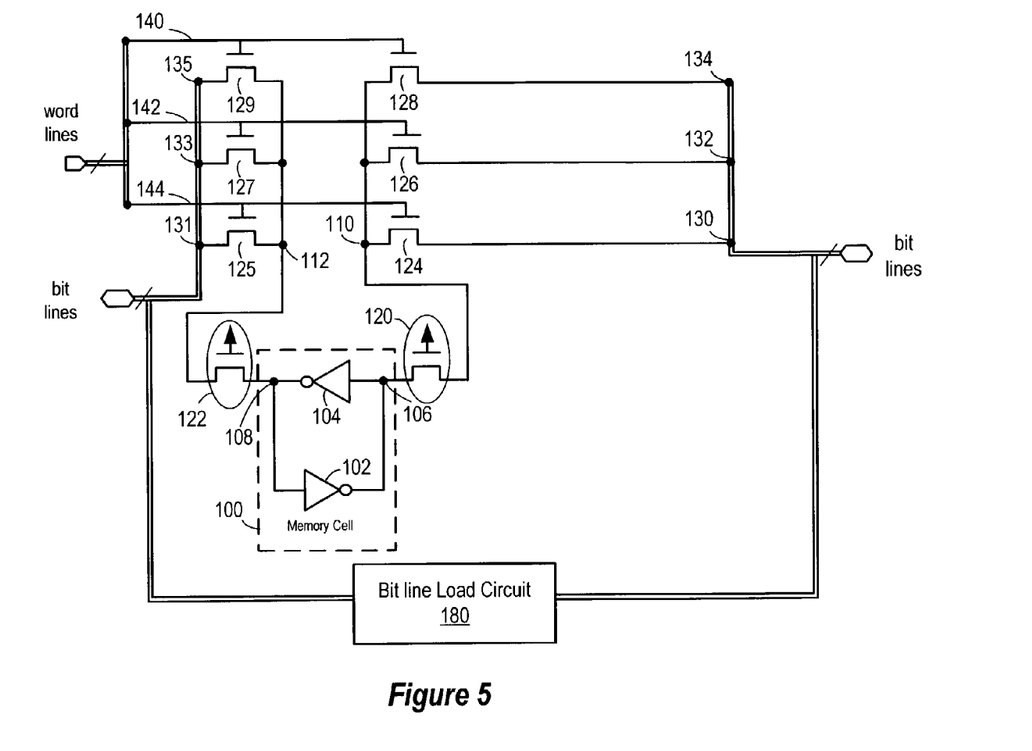
FIG. 5 shows a circuit diagram showing the structure of a multi-ported memory configuration in accordance with the present invention.

FIG. 5 shows a circuit diagram of a multi-ported memory configuration in accordance with the present invention implemented in a 3-port memory. A memory cell 100, for example, a static memory, comprises, for example, a pair of cross coupled inverters 104, 102 connected in parallel between two memory latch nodes 106, 108. With such memory cell configurations, when the word line (e.g., word line 140) for a particular port (e.g., the input/output path using the bit lines 134 and 135) is activated to write to the memory cell 100, the non-writing wordlines (e.g., word lines 142, 144) can also be activated, in which case the bits lines for the second port (e.g., the input/output path using the bit lines 132 and 133) and third port (e.g., the input/output path using the bit lines 130 and 131) are precharged. (As will be appreciated, multiple bit lines and wordlines are shown in the figures as dual lines that are bundled together in the end, even though they are not electrically tied together.)

To improve the stability and writability of such memory cell configurations, the first memory latch node 106 is connected to the first memory node 110 by a first current limiting transistor 120, which as depicted in FIG. 5 is an MOS transistor with its gate connected to a reference or power supply voltage to turn the transistor 120 "on." In similar fashion, second memory latch node 108 is connected to the second memory node 112 by a second current limiting transistor 122, which as depicted in FIG. 5 is an MOS transistor with its gate connected to a reference or power supply voltage to turn the transistor 122 "on." Through the current limiting transistors 120, 122, data stored in the memory cell 100 is connected to the bit lines 130–135 by transfer or pass gates 124–129.

In particular, opposing data values are stored in a memory cell 100. One of the data values stored in the memory cell 100 is output to bit line 134 via a first current limiting transistor 120 and a transfer gate 128 in accordance with the potential of a word line 140. The inverted data value stored in the memory cell 100 is output to a bit line 135 through second current limiting transistor 122 and a transfer gate 129 in accordance with the potential of a word line 140. In accordance with the potential of a word line 142, the data stored in the memory cell 100 is output to a bit line 132 through first current limiting transistor 120 and a transfer gate 126 in accordance with the potential of a word line 142, and the data inverted with respect to this data is transferred from the memory cell 100 to a bit line 133 through second current limiting transistor 122 and a transfer gate 127. Finally, in accordance with the potential of a word line 144, the data stored in the memory cell 100 is output to a bit line 130 through first current limiting transistor 120 and a transfer gate 124 in accordance with the potential of a word line 144 and the data inverted with respect to this data is transferred from the memory cell 100 to a bit line 131 through second current limiting transistor 122 and a transfer gate 125.

In the embodiment of the present invention where the gates of the current limiting transistors are connected to a reference or power supply voltage, the current limiting transistors act as currently limiters during the multi-port read and write operations to the memory cell 100. By providing normally-ON transistors 120, 122, the memory cell current is limited to the current flow permitted by the activated transistors 120, 122, thereby improving the beta-ratio by making it more consistent and enhancing the operation margin for both cell stability and writability.

In accordance with an alternate embodiment, the gates of the current limiting transistors 120, 122 may be selectively activated under control of gate control signals. By turning current limiting transistors 120, 122 off when read or write operations to the memory cell 100 are not required, improved isolation of the memory cell 100 is provided.

In connection with the bit line precharging described above, the circuit configuration depicted in FIG. 5 depicts a bit-line load circuit 180 for holding the potentials of the bit lines that are not used for writing data at power-supply potential VDD. As described more fully in U.S. Pat. No. 5,287,323 (which is hereby incorporated by reference as if fully set forth herein), the bit-line load circuit includes, for each bit line pair, a pair of gate coupled MOS transistor, each of which has its current paths connected, at one end, to the bit lines and, at the other end, to the power-supply potential VDD. Under control of a write-enable and/or read-enable signal and/or address signal, the commonly coupled gates of the MOS transistor pair is activated to pull the bit lines to the power supply voltage.

Figure 6:
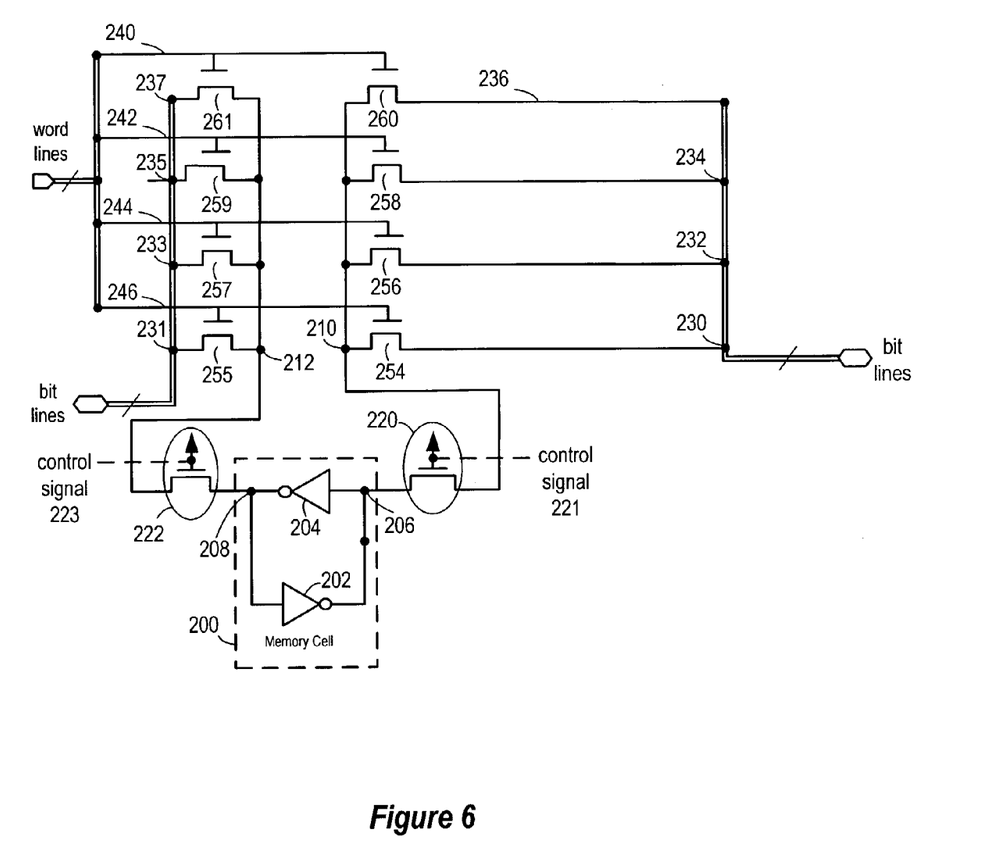
FIG. 6 shows a circuit diagram showing the structure of a multi-ported memory configuration in accordance with an alternate embodiment of the present invention.

FIG. 6 shows a circuit diagram of a multi-ported memory configuration in accordance with the present invention implemented in a 4-port memory. A memory cell 200 is provided consisting of a pair of cross coupled inverters 204, 202 connected in parallel between two memory nodes 206, 208.

With such memory cell configurations, when the word line (e.g., word line 240) for a first port (e.g., the input/output path using the bit lines 236 and 237) is activated to read or write to the memory cell 200, the non-writing/reading wordlines (e.g., word lines 242, 244, 246) can also be activated, in which case the bits lines for the second port (e.g., the input/output path using the bit lines 234 and 235), third port (e.g., the input/output path using the bit lines 232 and 233) and fourth port (e.g., the input/output path using the bit lines 230 and 231) are precharged.

To mitigate the effects of the additional current from the other connected ports, a pair of normally-ON transistors are inserted between wordline pass gates and the memory cell. These additional transistors act as current limiters to enhance the beta-ratio operating margins, thereby improving both cell stability and writability. In particular, the first memory latch node 206 is connected to the first memory node 210 by a first current limiting transistor 220, which as depicted in FIG. 6 is an MOS transistor with its gate connected to a reference or power supply voltage to turn the transistor 220 "on." In similar fashion, second memory latch node 208 is connected to the second memory node 212 by a second current limiting transistor 222, which as depicted in FIG. 6 is an MOS transistor with its gate connected to a reference or power supply voltage to turn the transistor 222 "on." Through the current limiting transistors 220, 222, data stored in the memory cell 200 is connected to the bit lines 230–237 by transfer or pass gates 254–261.

As described herein, the gates of the current limiting transistors 220, 222 may be selectively activated under control of gate control signals 221, 223. In this way, the current limiting function can be selectively controlled. It will be appreciated that the current limiting control function can be implemented in any of the multi-port embodiments of the present invention, regardless of the number of ports.

In particular, opposing data values are stored in a memory cell 200. One of the data values stored in the memory cell 200 is output to bit line 236 via a first current limiting transistor 220 and a transfer gate 260 in accordance with the potential of a word line 240. The inverted data value stored in the memory cell 200 is output to a bit line 237 through second current limiting transistor 222 and a transfer gate 261 in accordance with the potential of a word line 240. In accordance with the potential of a word line 242, the data stored in the memory cell 200 is output to a bit line 234 through first current limiting transistor 220 and a transfer gate 258, and the data inverted with respect to this data is transferred from the memory cell 200 to a bit line 235 through second current limiting transistor 222 and a transfer gate 259. In accordance with the potential of a word line 244, the data stored in the memory cell 200 is output to a bit line 232 through first current limiting transistor 220 and a transfer gate 256, and the data inverted with respect to this data is transferred from the memory cell 200 to a bit line 233 through second current limiting transistor 222 and a transfer gate 257. Finally, in accordance with the potential of a word line 246, the data stored in the memory cell 200 is output to a bit line 230 through first current limiting transistor 220 and a transfer gate 254, and the data inverted with respect to this data is transferred from the memory cell 200 to a bit line 231 through second current limiting transistor 222 and a transfer gate 255.

Figure 7A:
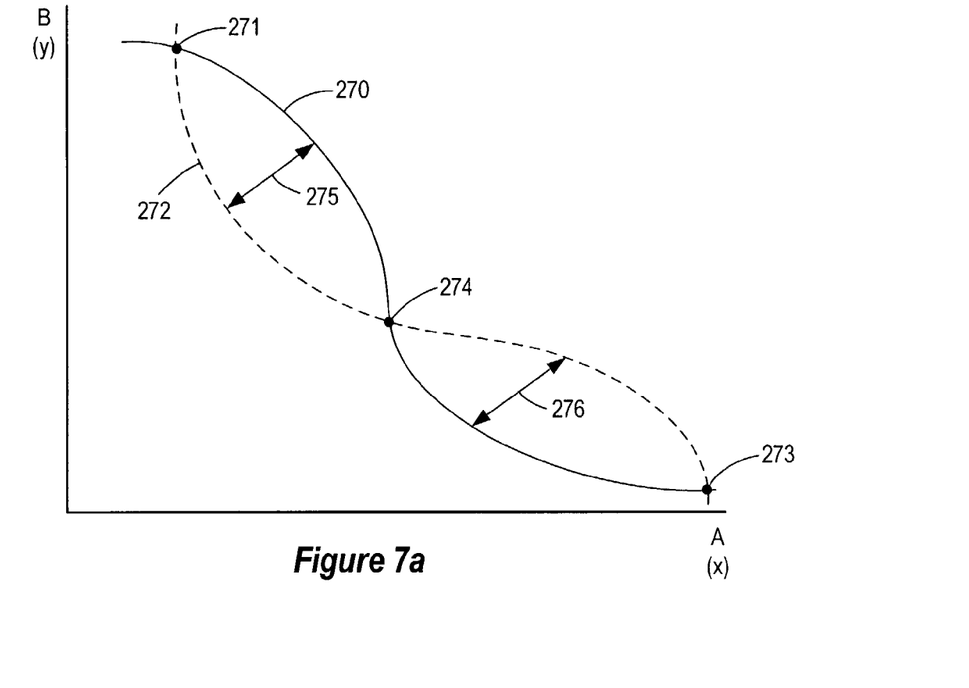
FIGS. 7a–7b are charts illustrating the stability and writability a multi-ported memory configuration in accordance with the present invention.
Figure 7B:
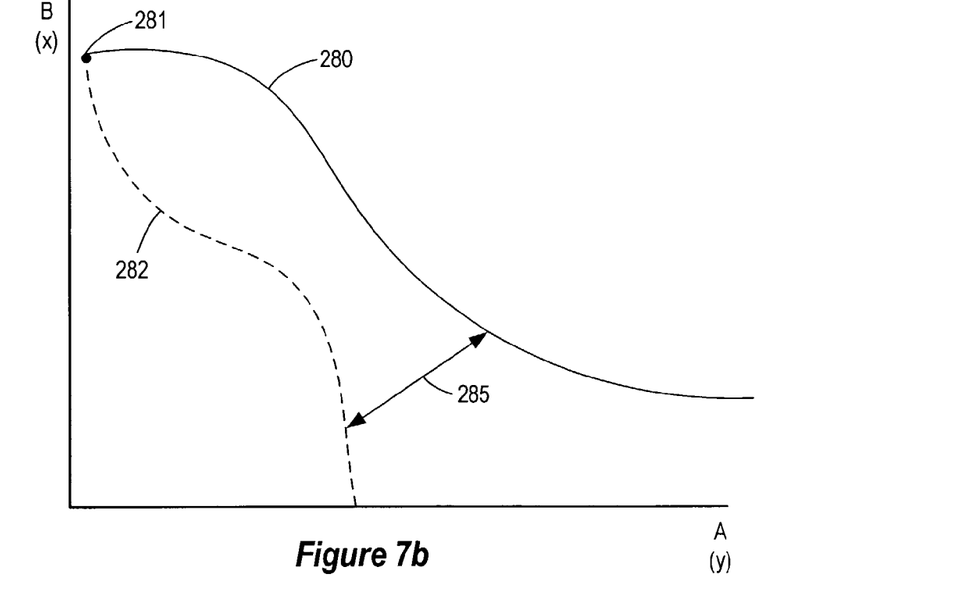

FIGS. 7a and 7b are charts illustrating the stability and writability a multi-ported memory configuration in accordance with the present invention. The inverter waveforms shown in FIG. 7a provide a representative characterization of the memory cell stability for a multi-port memory device according to the present invention, while the waveforms shown in FIG. 7b provide a representative characterization of the memory cell writability for a multi-port memory device according to the present invention. The depicted waveforms are provided for illustrative purposes, and are not intended to provide a quantitatively precise representation of the operation of the multi-port memory of the present invention.

As shown in FIG. 7a, the waveform 270 represents the response curve for a first memory cell inverter (e.g., inverter 104 in FIG. 5) in a multi-port memory of the present invention, where the voltage readings are taken between an A node (node 106) and a B node (node 108). Waveform 272 represents the response curve for a second memory cell inverter (e.g., inverter 102 in FIG. 5) as rotated about a diagonal axis in a multi-port memory of the present invention, where the voltage readings are taken between an X node (node 106) and a Y node (node 108). The response curves shown in FIG. 7a show a stable memory with two stable points 271, 273, and with good spread 275, 276 between the curves 270, 272. As a result, even if there is some shift in the waveforms due to process variation or noise etc., there is plenty of margin in the design to maintain stable memory circuit operation.

FIG. 7b shows that the memory circuit design of the present invention also has good writability. In particular the figure represents a case for writing "0" to node 106 (and thus writing "1" to node 108). The waveform 280 represents the response curve for a first memory cell inverter (e.g., inverter 104 in FIG. 5) in a multi-port memory of the present invention, where the voltage readings are taken between an A node (node 106) and a B node (node 108). Waveform 282 represents the response curve for a second memory cell inverter (e.g., inverter 102 in FIG. 5) as rotated about a diagonal axis in a multi-port memory of the present invention, where the voltage readings are taken between an X node (node 106) and a Y node (node 108). The response curves shown in FIG. 7b depict a memory with good writability, having a single stable point 281, which represents node 108 having a voltage of "1" and node 106 having a voltage of "0." In addition, the spread 285 between the curves 280, 282 promotes writability of the multi-port memory.

As has been described in detail, the semiconductor memory device according to this invention, which is of multi-port type, can perform data-writing and data-reading with improved reliability and stability and at high speed and can, therefore, be greatly useful as a cache memory, an image memory, or the like. The first and second embodiments, described above, are a 3-port memory and a 4-port memory, respectively. Nonetheless, the number of ports is not limited to these, and the present invention can be applied to a memory having multiple ports. The more ports a multi-port memory has, the more difficult it is to have circuit stability and acceptable operational margin. In view of this, the present invention, if used, is advantageous.

While the system and method of the present invention has been described in connection with the preferred embodiment, it is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A multi-port memory for storing data, comprising
   a memory cell comprising a first node for reading and writing a first data value to the memory cell and a second node for reading and writing a second data value to the memory cell;
   a first current limiter device coupled to the first node for limiting memory cell current flow during read and write operations;
   a second current limiter device coupled to the second node for limiting memory cell current flow during read and write operations;
   first and second transfer gates for transferring data stored in the memory cell to a first pair of bit lines in accordance with the potential of a first word line, where the first transfer gate is connected to the first current limiter device, and the second transfer gate is connected to the second Current limiter device; and
   third and fourth transfer gates for transferring data stored in the memory cell to a second pair of bit lines in accordance with the potential of a second word line, where the third transfer gate is connected to the first current limiter device, and the fourth transfer gate is connected to the second current limiter device.

2. The multi-port memory of claim 1, further comprising
   fifth and sixth transfer gates for transferring data stored in the memory cell to a third pair of bit lines in accordance with the potential of a third word line, where the fifth transfer gate is connected to the first current limiter device, and the sixth transfer gate is connected to the second current limiter device.

3. The multi-port memory of claim 2, further comprising
   seventh and eighth transfer gates for transferring data stored in the memory cell to a fourth pair of bit lines in accordance with the potential of a fourth word line, where the seventh transfer gate is connected to the first current limiter device, and the eighth transfer gate is connected to the second current limiter device.

4. The multi-port memory of claim 1, wherein each current limiter device comprises an MOS transistor.

5. The multi-port memory of claim 1, wherein each current limiter device comprises an MOS transistor that is normally turned on.

6. The multi-port memory of claim 1, wherein the first current limiter device comprises an insulated-gate transistor which has a current path connected, at one end, to the first node and, at the other end, to the first and third transfer gates, and a gate connected to a reference voltage.

7. The multi-port memory of claim 1, wherein each transfer gate comprises an insulated-gate transistor which has a current path connected, at one end, to a current limiter device and, at the other end, to a bit line, and a gate connected to a word line.

8. A multi-port memory, comprising:
a memory having a memory node;
a current limiting device coupled to the memory node; and
a plurality of transfer gates coupled to the current limiting device, where each transfer gate has a current path coupled between a bit line and the current limiting device so that data passes between the bit line and the memory node via the current limiting device under control of a word line signal that is applied to the gate of the transfer gate.

9. The multi-port memory of claim 8, wherein the current limiting device comprises an MOS transistor.

10. The multi-port memory of claim 8, wherein the current limiting device comprises an MOS transistor that is normally turned on.

11. The multi-port memory of claim 8, wherein the current limiting device comprises an insulated-gate transistor which has a current path connected, at one end, to the memory node and, at the other end, to said plurality of transfer gates, and a gate connected to a reference voltage.

12. The multi-port memory of claim 8, wherein the current limiting device comprises an NMOS transistor having a current path connected between the memory node and the plurality of transfer devices.

13. The multi-port memory of claim 8, wherein the memory comprises a first and second memory nodes, the current limiting device comprises first and second current limiting devices connected to the first and second memory nodes, respectively, and the plurality of transfer gates comprises a first pair of transfer gates and a second pair of transfer gates, where each pair of transfer gates connects the first and second current limiting devices, respectively, to a bit line pair comprising a memory port.

14. The multi-port memory of claim 13, wherein the plurality of transfer gates further comprises a third pair of transfer gates, where the third pair of transfer gates connects the first and second current limiting devices, respectively, to a bit line pair comprising a third memory port.

15. The multi-port memory of claim 14, wherein the plurality of transfer gates further comprises a fourth pair of transfer gates, where the fourth pair of transfer gates connects the first and second current limiting devices, respectively, to a bit line pair comprising a fourth memory port.

16. The multi-port memory of claim 8, wherein the memory node comprises a memory output node, the current limiting device comprises an NMOS transistor having a current path connected to the memory output node, and the plurality of transfer gates comprises a first transfer gate connected between the current path of the NMOS transistor and a first bit line under control of a first word line signal, a second transfer gate connected between the current path of the NMOS transistor and a second bit line under control of a second word line signal and a third transfer gate connected between the current path of the NMOS transistor and a third bit line under control of a third word line signal.

17. The multi-port memory of claim 8, wherein each transfer gate comprises an insulated-gate transistor which has a current path connected, at one end, to a current limiting device and, at the other end, to a bit line, and a gate connected to a word line.

18. A multi-port semiconductor memory device, comprising:
memory cell having a first and second memory node;
a current limiting device coupled to each memory node, said current limiting device comprising at least one normally-ON transistor; and
plurality of transfer devices coupled to each current limiting device, where each transfer device has a current pat coupled between a bit line and the current limiting device to which the transfer device is coupled so that data passes between the bit line and the memory node via the current limiting device under control of a word line signal tat is applied to the transfer device.

19. The multi-port semiconductor memory device of claim 18, wherein
the memory cell comprises a pair of inverters cross coupled in parallel between the first and second memory nodes designed to store a data value;
each current limiting device comprises an insulated-gate transistor which has a current path and a gate, said current path connected, at one end, to a memory node and, at the other end, to a current path of a transfer device, and said gate being connected to a power supply voltage, said current limiting device limiting the amount of current that passes to and from the memory cell during data read and write operations; and
the plurality of transfer devices comprises
a first pair of insulated-gate transistors, each of which has a current path and a gate, said current path connected, at one end, to a first and second current limiting device, respectively, and, at the other end, to a first pair of bit lines, respectively, and each said gate being connected to a fast word line, said first pair of insulated-gate transistors transferring the opposite data values stored in said memory cell to the bit lines of said first pair, respectively, in accordance with the potential of the first word line;
a second pair of insulated-gate transistors, each of which has a current path and a gate, said current path connected, at one end, to the first and second current limiting device, respectively, and, at the other end, to a second pair of bit lines, respectively, and each said gate being connected to a second word line, said second pair of insulated-gate transistors transferring the opposite data values stored in said memory cell to the bit lines of said second pair, respectively, in accordance with the potential of the second word line; and
a third pair of insulated-gate transistors, each of which has a current path and a gate, said current path connected, at one end, to the first and second current limiting device, respectively, and, at the other end, to a third pair of bit lines, respectively, and each said gate being connected to a third word line, said third pair of insulated-gate transistors transferring the opposite data values stored in said memory cell to the bit lines of said third pair, respectively, in accordance with the potential of the third word line.

20. The multi-port semiconductor memory device of claim 19, wherein the plurality of transfer devices further comprises a fourth pair of insulated-gate transistors, each of which has a current path and a gate, said current path connected, at one end, to the first and second current limiting device, respectively, and, at the other end, to a fourth pair of bit lines, respectively, and each said gate being connected to a fourth word line, said fourth pair of insulated-gate transistors transferring the opposite data values stored in said memory cell to the bit lines of said fourth pair, respectively, in accordance with the potential of the fourth word line.

* * * * *